(12) United States Patent
Rooth

(10) Patent No.: US 6,268,680 B1
(45) Date of Patent: Jul. 31, 2001

(54) SURFACE ACOUSTIC WAVE TRANSDUCER

(75) Inventor: Stig Rooth, Tonsberg (NO)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/406,707

(22) Filed: Sep. 28, 1999

(30) Foreign Application Priority Data

Oct. 5, 1998 (NO) .................................................. 984653

(51) Int. Cl.$^7$ .................................................. H03L 41/04
(52) U.S. Cl. .................................. 310/313 R; 310/313 B
(58) Field of Search ........................... 310/313 B, 313 R, 310/313

(56) References Cited

U.S. PATENT DOCUMENTS

| | | | |
|---|---|---|---|
| 4,162,415 | * | 7/1979 | Andree .............................. 310/313 B |
| 5,663,695 | * | 9/1997 | Tanaks .............................. 310/313 B |

FOREIGN PATENT DOCUMENTS

0454288A1 * 1/1991 (EP) .............................. H03H/9/145
0 454 288 A1 10/1991 (EP) .
0 533 431 A1 3/1993 (EP) .

* cited by examiner

Primary Examiner—Elvin Enad
Assistant Examiner—Karen Addison
(74) Attorney, Agent, or Firm—Sughrue, Mion, Zinn, Macpeak & Seas, PLLC

(57) ABSTRACT

A surface acoustic wave transducer with a piezoelectric substrate and at least two electrodes on the surface of the substrate wherein the electrodes comprise fingers which overlap with the fingers of another electrode in a projection parallel to the surface of the substrate is described. The fingers comprise coupling fingers which are located adjacent to a finger of another electrode and which have a high coupling efficiency to the surface acoustic waves. A structure with low surface acoustic wave reflection is located between at least two coupling fingers of the same electrode and the surface acoustic wave propagation velocity of the low reflecting structure and the coupling fingers is equal. Furthermore, a filter comprising the transducer is proposed.

14 Claims, 4 Drawing Sheets

SURFACE ACOUSTIC WAVE TRANSDUCER

BACKGROUND OF THE INVENTION

The invention relates to a surface acoustic wave transducer with a piezoelectric substrate and at least two electrodes on the surface of the substrate wherein the electrodes comprise fingers which overlap with the fingers of another electrode in a projection parallel to the surface of the substrate and a filter consisting of SAW transducers.

Surface acoustic wave (SAW) transducers can be used to design electronic filters which are optimized for a broad, flat passband with steep transition edges to the stopbands. A transducer comprises at least two electrodes which are located on the surface of a piezoelectric substrate, e. g. a crystal of quartz or lithium tantalate in a specific cut and orientation. Typically, the electrodes are manufactured by surface metallization of the substrate and consist each of a contact pad with fingers which project from one edge of the contact pad. The contact pads of two electrodes are arranged parallel to each other with the fingers extending inwardly between them and being interdigitated. Therefore, the fingers of both electrodes overlap in projection parallel to the contact pads.

When an electric signal is applied to the electrodes, the voltage causes elastic deformations of the substrate in the gaps between the fingers. The deformations propagate as surface acoustic waves in direction parallel to the contact pads and can be received by another transducer on the same substrate. The frequency of the maximum response of the SAWs to an electric signal is related to the fundamental period $\lambda$ of the fingers, i. e. an optimum coupling is achieved if the wavelength $\lambda$ of the surface acoustic waves is approximately equal to the width of two fingers on adjacent electrodes with their corresponding gaps. The location and overlap of the fingers of the transducer correspond approximately to the Fourier transform of its frequency response which consists of a main lobe and several side lobes for a transducer with a single passband as it is well known in the art.

It is of high importance that transducers have the lowest possible insertion loss and a flat passband without curvature at the edges. Besides of bidirectional loss and SAW propagation loss, the insertion loss of such a transducer with a suitably tuned feeding circuit is dominated by the Q-value if the ohmic losses are sufficiently low. The Q-value of the transducer is defined by $$Q=|\text{Im}(Y)|/\text{Re}(Y)$$

wherein Y is the transducer admittance and Re and Im denote the real and imaginary value respectively. A low Q-value can easily be obtained with $\lambda/4$ wide fingers separated by gaps of equal width. This structure has a high coupling to the surface acoustic waves and a correspondingly low Q-value. Even if a filter with a broad passband is to be designed which requires a small number of fingers for a given length in the main lobe of the transducer, a low Q-value may be attained in this way.

Due to the surface inhomogeneities caused by the fingers, a part of the propagating surface acoustic waves is reflected at each finger. This effect distorts the surface acoustic waves, especially if large numbers of fingers are present on the substrate. The effect is most pronounced for $\lambda/4$ wide fingers with gaps of equal width because in this case all SAW reflections add constructively. Consequently, fingers with a width of $\lambda/4$ are avoided in SAW devices in the state of the art. As alternatives, split fingers consisting of two adjacent fingers with a width of $\lambda/8$ on the same electrode or combinations of fingers with a width of $3\lambda/8$ and $\lambda/8$ have been proposed. Both structures are low reflecting because the partial waves reflected at different fingers do not interfere in phase. However, the Q-value is higher than that of a structure with $\lambda/4$ wide fingers.

SUMMARY OF THE INVENTION

It is therefore an object of the present invention to propose a transducer which has a low Q-value and causes only small reflections of the surface acoustic waves. It is a further object of the invention to develop a SAW filter which causes low reflections of the surface acoustic waves and has a high coupling to the surface acoustic waves. It is a third object of the invention to propose a broadband SAW filter with a large relative band width, steep edges of the passband and a low insertion loss.

According to the present invention, the fingers comprise coupling fingers which are located adjacent to a finger of another electrode and which have a high coupling efficiency to the surface acoustic waves, a structure with low surface acoustic wave reflection is located between at least two coupling fingers of the same electrode and the surface acoustic wave propagation velocity of the low reflecting structure and the coupling fingers is equal.

The invention is based on the concept that the number of fingers per length unit which have a high coupling efficiency to the surface acoustic waves has to be small in a broadband transducer. These coupling fingers which are located adjacent to a finger of another electrode are spaced at predetermined intervals which ensure the proper phase delay between the fingers for the desired shape of the frequency response. In the intervals between the coupling fingers, a structure with a low SAW reflections is located. The low reflecting structure ensures that the propagation velocities of the surface acoustic waves in the region of the coupling fingers and the intervals in between are equal or at least nearly equal. In this way, distortions of the acoustic waves and difficulties in the design of the transducer are avoided. The SAW velocity inside the transducer is influenced by the surface area covered by the electrodes, the amount of electrode material on the surface of the substrate, the number of finger edges per length unit and the depth of grooves in the substrate. The proposed structure may be confined to the main lobe and the strongest sidelobes of the transducer were the largest part of energy is transferred to the SAWs while the structure of the other sidelobes can be a customary transducer structure.

The proposed transducer has a low Q-value due to the fingers with high coupling efficiency to the SAWs and consequently a low insertion loss even if the relative bandwidth is large. Preferably, a material and orientation of the substrate is chosen which ensures that only Rayleigh waves are excited on the surface of the substrate while bulk waves are avoided. However, other substrate materials and orientations can be used for other, e.g. leaky, surface waves. Distortions of the surface acoustic waves are avoided because the low reflecting structure ensures a nearly constant propagation velocity of the SAWs throughout the transducer while a constructive interference of partial waves generated by this structure is excluded. Furthermore, the efficient coupling to the SAWs causes a low sensitivity of the transducer to temperature changes. Preferably, the width of a coupling finger is equal to the width of the gap to the adjacent finger of the other electrode. However, structures with ratios of finger width to gap width differing slightly from unity are possible, e. g. for adjustments of the excited phase or velocity of the SAWs.

In a preferred embodiment of the invention, the width of the coupling fingers and the spacing of adjacent coupling fingers on different electrodes is $\lambda/4$ wherein $\lambda$ is the wavelength of the surface acoustic waves at the first harmonic frequency response of the transducer. It can be shown by theoretical calculations that this structure has the lowest Q-value if only transducers with two electrodes are treated. Slightly different widths of the fingers and gaps are possible.

Especially if the coupling fingers have a width of $\lambda/4$, constructive interference of partial waves reflected at them may lead to undesired distortions of the SAWs. It is therefore proposed to embed the coupling fingers at least partially into the substrate. The depth of the embedding is to such an extent that the net reflection coefficient of the finger for surface acoustic waves is at least approximately zero. This ensures that no reflected surface waves are created at the coupling fingers and there is no distortion of the surface acoustic waves. The total reflection coefficient R of a finger on the surface can be represented by $$R=C_E+j \sin(2\pi w/\lambda)[C_G h_G/\lambda - C_F h_F/\lambda]$$

which describes the finger as a superposition of a rectangular bar and a groove in the surface having both width w. $C_E$, $C_G$ and $C_F$ are the reflection coefficients caused by the electric charge distribution on a single finger for a given substrate material, the rectangular groove in the surface and the mechanical loading of the finger respectively. $h_G$ and $h_F$ are the groove depth and finger height respectively and $j=\sqrt{-1}$. The derivation of this formula is described in S. Datta, B. J. Hunsinger, J. Appl. Phys. Vol. 50, 1979, pp. 5661–5665 and S. Rooth, A. Rønnekleiv, IEEE Ultrasonic Symposium Proc., Seattle, 1995, pp. 281–285. It is an approximation for thin fingers and shallow grooves.

The total reflection coefficient of a finger can be forced to zero by controlling the groove depth and the finger thickness for materials with suitable coefficients $C_E$, $C_G$ and $C_F$. This is also possible in situations when the approximation is no longer valid, i. e. for thick fingers and deep grooves, but has in this case to be described by another mathematical model. In practice, the reflection coefficient will deviate slightly from zero due to production tolerances which have to be kept on the order of single atomic layer. Very small production tolerances are required for large transducers with a high number of fingers which can interfere in phase. Therefore, the approach is most effective if there is only a limited number of fingers which can interfere constructively because in this case a small residual reflectiveness due to production tolerances is acceptable. Because the reflection coefficient R depends on the width of a finger, it can generally be adjusted to zero only for fingers of a specific width within the structure which are preferably the coupling fingers.

In an advantageous embodiment of the invention, reflections from the low reflecting structure and the coupling fingers are avoided in different ways. As a result, a control of the height and depth of embedding is important only for the coupling fingers which avoids excessively small production tolerances, especially if the fraction of coupling fingers in the transducer is small. The low reflecting structure consists preferably of fingers which are located at positions where surface acoustic waves reflected by them do not interfere in phase. Therefore, reflections distorting the SAWs are avoided even if the reflection coefficient of the fingers deviates from zero. The fingers of the low reflecting structure may either be part of an electrode or be detached from both electrodes. For example, suitable finger widths in the low reflecting structure are $\lambda/8$, $\lambda/6$ or $3\lambda/8$ separated by gaps of equal width. A ratio between the finger width and the gap width which differs from one is also possible. Furthermore, different fingers and gaps in the low reflecting structure may have different widths. In this way, the low reflecting structure of the transducer can be fitted in the space between the coupling fingers which are located at their predefined positions.

The proposed design of the transducer is advantageously applicable at the first harmonic frequency response. In this case, measurements show that a decreased insertion loss of about 1 dB is attainable compared to a transducer in the state of the art. At the third harmonic frequency, the proposed transducer reduces the insertion loss by approximately 6 dB; equivalently the band width of the SAW filter can be doubled without increasing the insertion loss. The adaptation of the main response to the first or third harmonic is performed by adjusting the impedance of the feeding or output circuit for a pair of electrodes to the impedance of the electrodes at the respective frequency. The width of the coupling fingers is adapted to the wavelength at the respective harmonic frequency which means that the width of the coupling fingers always corresponds to the main response of the transducer. For example, if the wavelength is reduced to a third, the width of the coupling fingers has also be reduced to a third. In this way, the coupling fingers have both in the first and the third harmonic design a width of e. g. $\lambda/4$. In contrast, the width of the fingers in the low reflecting structures is chosen according to the desired harmonic, i. e. fingers with a width of $\lambda/8$ in a first harmonic design have a width of $3\lambda/8$ in the third harmonic design. Finally, if a structure is adapted from a first to a third harmonic design it is also of advantage to vary the overlap and position of the coupling fingers by small amounts in order to attain a flat pass band of the transducer.

To achieve the desired shape of the transmission band of a transducer, it is known in the art to vary the overlap of the coupling fingers as a function of their position on the electrodes. For this aim, two methods are used. In an apodized weighted transducer, the length of the fingers measured from the contact pad of the electrode to the tip is varied as a function of their position on the electrode. Consequently, the overlap of adjacent fingers of different electrodes in projection parallel to the contact pads is a function of their position. Especially in the case of an apodized weighted transducer, the proposed transducer structure may be confined to the main lobe and the strongest sidelobes were the largest part of energy is transferred to the SAWs. In a withdrawal weighted transducer, a reduced overlap is achieved by omission of single fingers from the structure. In this way, the overlap between the electrodes is smaller compared to a pair of electrodes with interdigitated fingers of alternating polarity. By varying the number of omitted fingers along the length of the electrode, the overlap depends on the position of a finger on the electrode. Both methods of weighting can advantageously be applied to a transducer according to the present invention.

In a preferred embodiment of the invention, the transducer is a bidirectional transducer which radiates surface waves both in direction parallel to the contact pads and in the opposite direction. Those waves radiated in the opposite direction are absorbed by an absorber material on the substrate surface. For single phase transducers with only two electrodes, a bidirectional transducer has the advantage of a very simple design. The principle of the invention can, however, also be applied to a unidirectional transducer.

An advantageous application of the proposed transducer is an electronic filter. In general, the filter consists of two transducers on a single piezoelectric substrate. One transducer serves as input to convert an AC electrical signal into surface acoustic waves while the other transducer generates an electrical output signal in response to the acoustic waves received. Filters with at least one transducer according to the proposed design have a very low insertion loss and a large relative band width with a flat passband and steep edges at the transition to the stopbands.

In a very effective design of a SAW filter, one transducer is an apodized weighted transducer and the other transducer is a withdrawal weighted transducer.

DETAILED DESCRIPTION OF THE INVENTION

Figure 1:
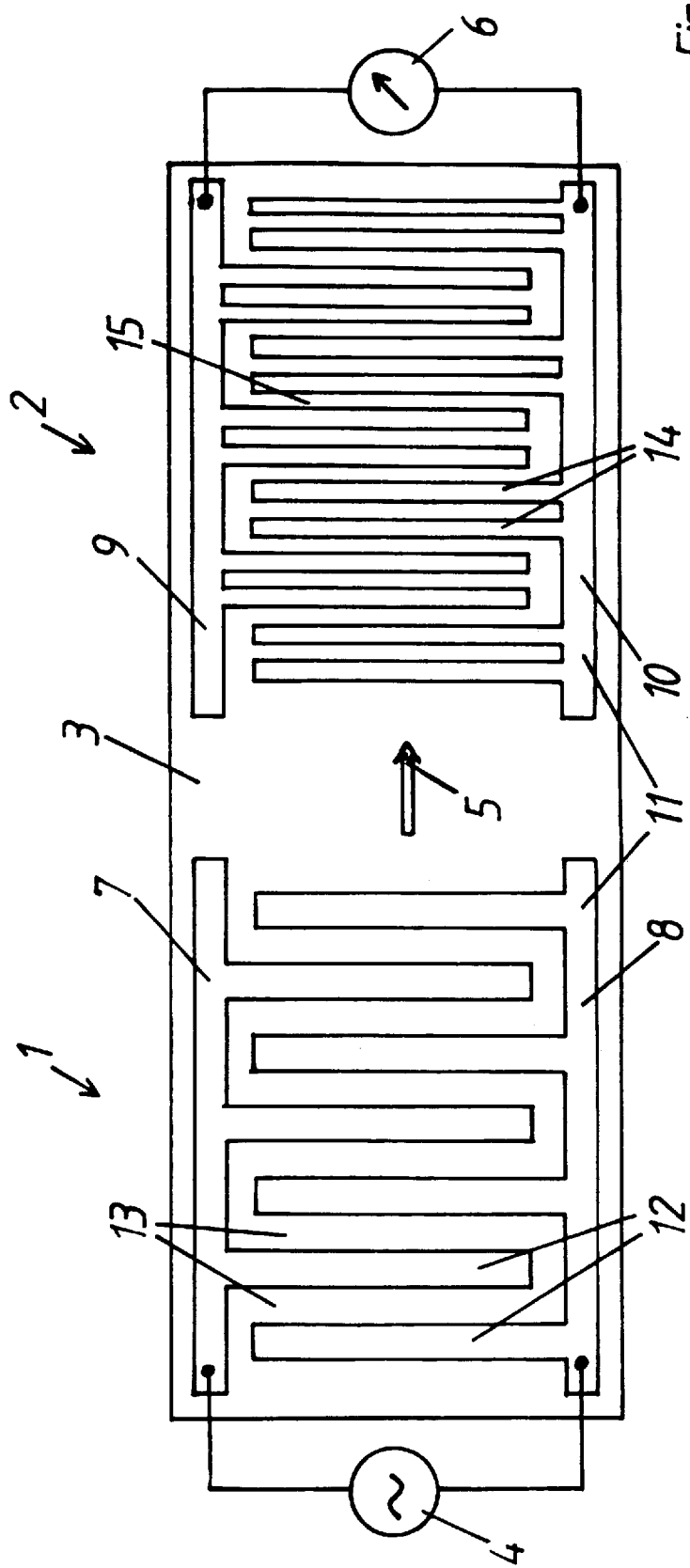
FIG. 1 is a schematic view of a filter in the state of the art consisting of two SAW transducers.

FIG. 1 shows a surface acoustic wave filter as it is known in the state of the art. It consists of two transducers 1, 2 which are mounted on a piezoelectric substrate 3, e. g. a crystal of quartz or lithium tantalate. The first transducer 1 is connected to a feeding circuit 4 which provides an AC signal and converts this signal into surface acoustic waves. The SAWs propagate in direction of arrow 5 towards the second transducer 2 which converts them back into an electrical signal which can be further processed by an output circuit 6.

Each transducer consists of two electrodes 7–10 which in turn each comprise a contact pad 11 from which fingers 12, 14 extend in the direction of the adjacent electrode 7–10. All contact pads 11 are arranged parallel to each other and the propagation direction of the surface acoustic waves. The fingers 12, 14 of an electrode pair overlap in projection parallel to arrow 5. A voltage applied to transducer 1 causes deformations of the substrate 3 in the region of fingers 12 and the gaps 13 between them due to the piezoelectric effect. These deformations propagate as surface acoustic waves on the substrate if the feeding circuit 4 provides an AC signal.

The transducer 1 on the left side of the substrate 3 consists of fingers 12 and gaps 13 which have a width of $\lambda/4$. Therefore, partial waves reflected at the fingers 12 interfere in phase and cause strong distortions of the propagating surface acoustic waves, especially if a large number of fingers is present. As an alternative, transducers with split fingers as shown in the right part of FIG. 1 have been proposed. Here, the fingers 14 at both contact pads 11 are grouped in pairs. The fingers 14 and the gaps 15 between them have a width of $\lambda/8$ avoiding constructive reflections at the expense of a lower coupling efficiency to the SAWs. In FIG. 1, the different transducer structures are combined mainly for illustrative purposes. In most practical applications, both transducers in a filter will either have the $\lambda/4$ structure of transducer 1 or the $\lambda/8$-split finger structure of transducer 2.

Figure 2:
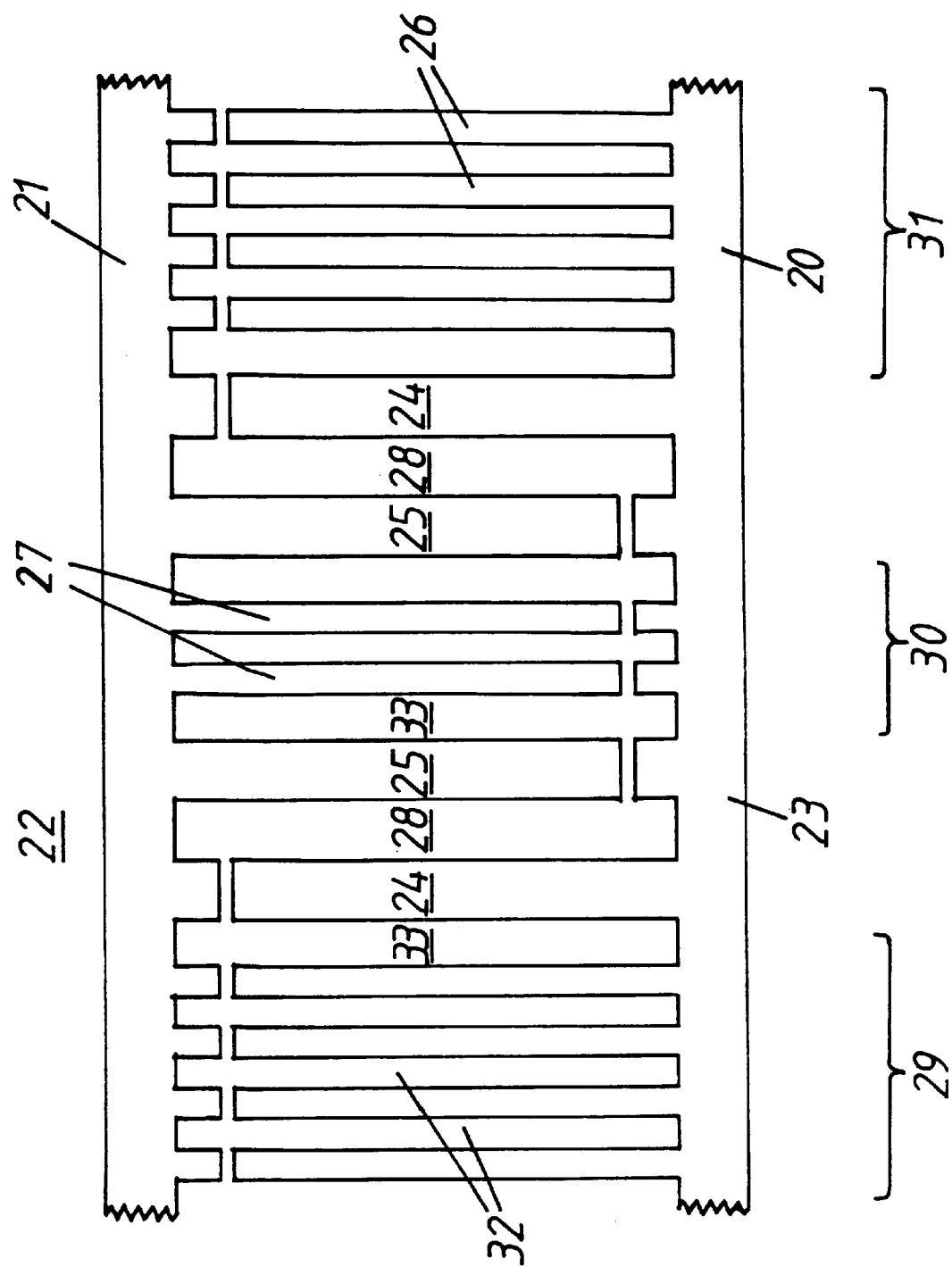
FIG. 2 is a partial view of an electrode pair in a transducer according to the present invention.

FIG. 2 shows the design of a pair of electrodes 20, 21 in a transducer according to the present invention. Because they can comprise several thousand fingers, only a segment of the electrodes 20, 21 is represented. They consist of a metal, e. g. aluminium, which is deposited on substrate 22. As in the transducers in FIG. 1, each electrode 20, 21 consists of a contact pad 23 and fingers 24–27 extending in the direction of the counterelectrode.

The electrodes 20, 21 are provided with two different kinds of fingers. Only the fingers 24 of electrode 20 are located adjacent to fingers 25 on the other electrode 21. Voltages applied to electrodes 20, 21 cause initial deformations of substrate 22 predominantly in the gaps 28 between the fingers 24, 25, i. e. they are the only fingers coupling to the substrate 22. The other fingers 26, 27 are not interdigitated with fingers from the other electrode but are only adjacent to fingers 24–27 on the same one. Therefore, the fingers 26, 27 do not provide a significant coupling between electric signals on the electrodes 20, 21 and the surface acoustic waves on substrate 22. The ratio in number between non-coupling fingers 26, 27 and coupling fingers 24, 25 is generally greater than 1, preferably on the order of 5 to 10 or more so that a transducer with a total number of several thousand fingers comprises for example 150 to 200 coupling fingers 24, 25.

Fingers 24, 25 are optimized for a high coupling to surface acoustic waves on substrate 22. This is achieved by an equal width of $\lambda/4$ of the fingers 24, 25 and gap 28 between them. It can be shown that this structure has one of the lowest Q-values for single phase feeded transducers with a ratio of finger width to gap width of one. A disadvantage of the structure is that the centres of neighbouring fingers 24, 25 are separated by a distance of $\lambda/2$. A wave which is generated at one finger and reflected at the adjacent finger therefore travels a distance of $\lambda$ before arriving again at the first finger. Consequently, the original and the reflected wave interfere in phase which causes high reflections of a $\lambda/4$ structure, especially if a large number of fingers is present.

The fingers 26, 27 between the coupling fingers 24, 25 constitute low reflecting structures 29–31 which fill those intervals which are necessary to provide the proper phase delay of surface acoustic waves generated at the coupling fingers 24, 25. The low reflecting structures 29–31 do not distort the propagating acoustic waves because the width of the fingers is $\lambda/8$ and they are separated by gaps 32 of the same width. Therefore, partial waves reflected at adjacent fingers interfere with a phase difference of $\lambda/2$, i. e. in anti-phase. This causes partial waves reflected at adjacent fingers 26, 27 to cancel each other. At the ends of the low reflecting structures 29–31 there are gaps 33 of an intermediate size which ensure the proper phase delay between neighbouring groups of coupling fingers 24, 25. In the drawing, gaps 33 have a width of $3\lambda/16$ to adjust the distance between the two coupling fingers 25 on the lower electrode 20 to $\lambda$. The low reflecting structures 29–31 ensure a nearly constant propagation velocity for the SAWs throughout the transducer because for a substrate 22 with low piezoelectric coupling like quartz, the SAW velocity in structures with $\lambda/4$ wide fingers and $\lambda/8$ wide fingers is approximately equal for an equal finger to gap ratio.

Figure 3:
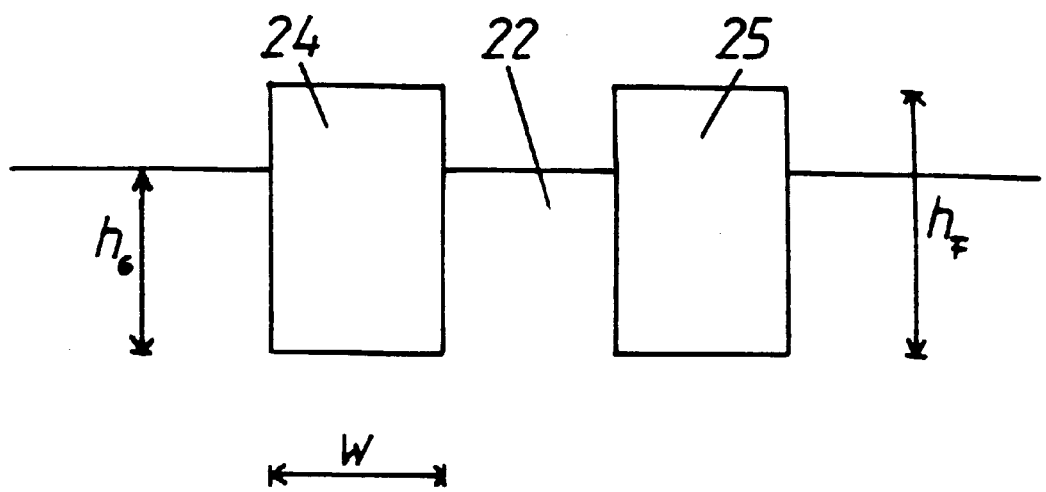
FIG. 3 is a cross section through two fingers in a SAW transducer according to the present invention.

FIG. 3 shows an enlarged, schematic cross section through two coupling fingers 24, 25 of the electrode structure. The cross section shows that the fingers are partially embedded in the surface of substrate 22. By adjusting the depth of the embedding $h_G$ and the total height of the fingers $h_F$, a reflection coefficient of the fingers 24, 25 for surface acoustic waves of zero can be achieved. As the reflection coefficient depends also on the width w of the fingers, generally only the reflection coefficient of the fingers with a specific width w can be tuned to zero. Therefore, it is proposed that the reflection at the λ/4 fingers is avoided in this way because these fingers interfere in phase.

Figure 4:
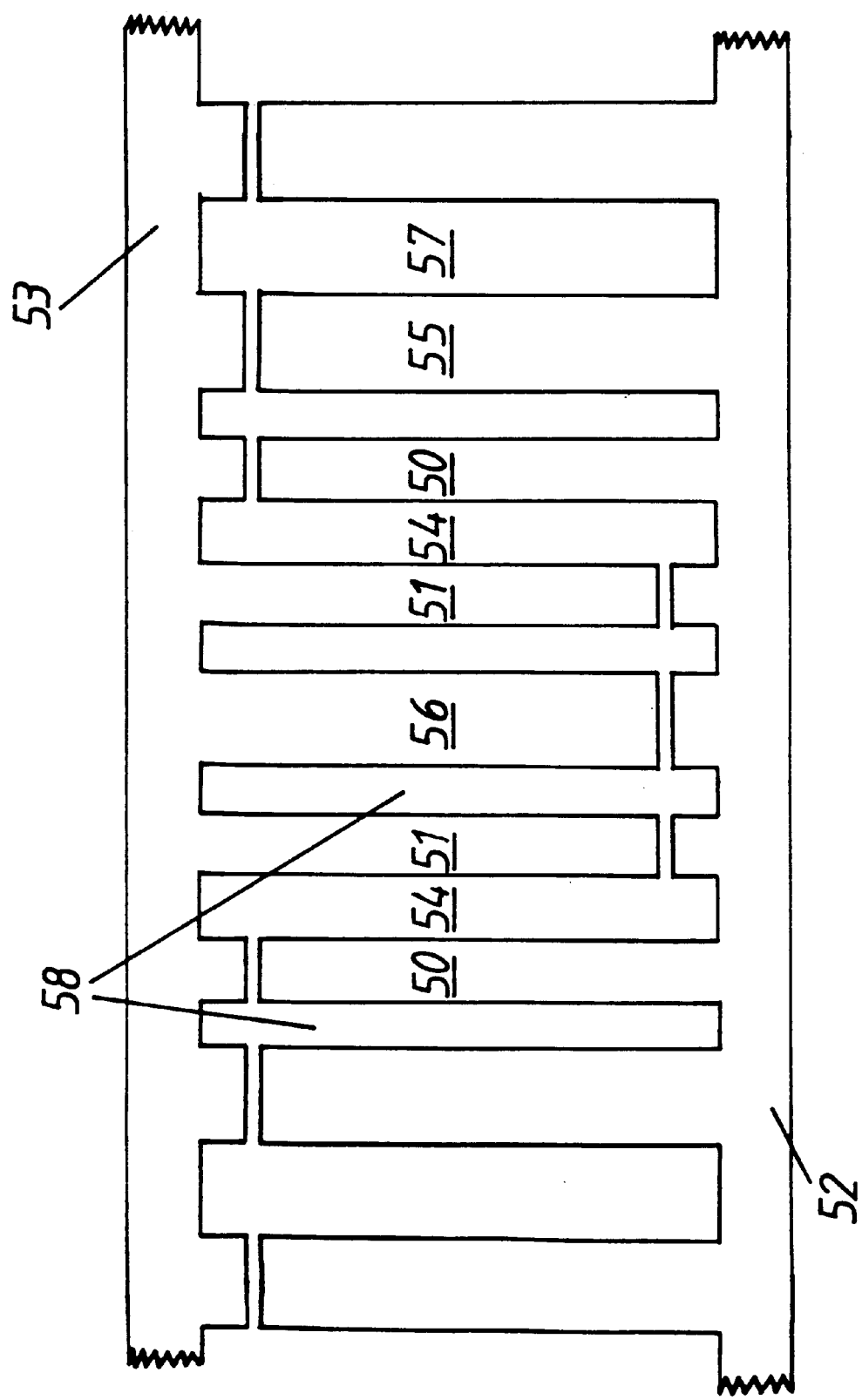
FIG. 4 is a partial view of an electrode pair in a transducer according to the present invention with a third harmonic frequency response as main response.

The transducer represented in FIG. 2 is a transducer with the first harmonic frequency response as main response. In FIG. 4, a transducer structure with the third harmonic frequency response as main response is shown. The coupling fingers 50, 51 on both electrodes 52, 53 and the gaps 54 between them each have a width of λ/4 as in the first harmonic design. In contrast, the width of the fingers 55, 56 and the gaps 57 in the low coupling structures is 3λ/8. As in FIG. 2, the width of gaps 58 between the coupling fingers 50, 51 and the low reflecting structures may differ in width to adapt the location of the coupling fingers 50, 51 to the desired positions. As this may be difficult in some cases due to the large width of the non-coupling fingers, also the width of the fingers 55, 56 in the low coupling structures can be adjusted. The impedance of feeding and output circuits 4, 6 connected to the transducers have to be adjusted to the transducer impedance at the third harmonic.

It should be noted that FIGS. 2 and 4 have an identical scale with respect to the wavelength λ of the surface acoustic waves at the main response of the transducer.

If the transducer in FIG. 4 is operated at a three times higher frequency than the one in FIG. 2, the wavelength is reduced to a third. Therefore, in this case the λ/4 fingers in FIG. 4 have only a third of the width of the λ/4 fingers in FIG. 2 while the width of the λ/8 fingers in FIG. 2 and the 3λ/8 fingers in FIG. 4 is equal.

The above embodiments admirably achieve the objects of the invention. However, it will be appreciated that departures can be made by those skilled in the art without departing from the scope of the invention which is limited only by the claims.

What is claimed is:

1. A surface acoustic wave transducer with a piezoelectric substrate and at least first and second electrodes on the surface of the substrate wherein the electrodes each comprise fingers which overlap with the fingers of another electrode in a projection parallel to the surface of the substrate, characterized in that the fingers of each electrode are comprised of coupling fingers which are each located adjacent to a finger of another electrode and which have a high coupling efficiency to the surface acoustic wave, a structure with low surface acoustic wave reflection is located between at least two coupling fingers of the first electrode, and the surface acoustic wave propagation velocity of the low reflecting structure and the coupling fingers is equal.

2. Transducer according to claim 1, characterized in that the width of the coupling fingers and the spacing of adjacent coupling fingers of different electrodes is λ/4 wherein λ is the wavelength of the surface acoustic waves at the fundamental frequency response of the transducer.

3. Transducer according to claim 1 or 2; characterized in that coupling fingers are at least partly embedded in the substrate and the depth of the embedding is to such an extent that the reflection of the coupling fingers for the surface acoustic wave is zero.

4. Transducer according to claim 1, characterized in that the low reflecting structure consists of fingers which are located at positions where reflected surface acoustic waves do not interfere in phase.

5. Transducer according to claim 4, characterized in that the spacing of the fingers of the low reflecting structure is equal to their width and the width is λ/8 or λ/6 or 3λ/8.

6. Transducer according to claim 1, characterized in that the main response of the transducer is a first harmonic frequency response.

7. Transducer according to claim 1, characterized in that the main response of the transducer is a third harmonic frequency response.

8. Transducer according to claim 1, characterized in that the overlap of the fingers is withdrawal weighted and/or apodized weighted.

9. Transducer according to claim 1, characterized in that the transducer is a bidirectional transducer.

10. Filter consisting of two surface acoustic wave transducers on a piezoelectric substrate, characterized in that at least one transducer is a transducer according to claim 1.

11. Filter according to claim 10, characterized in that one transducer is an apodized transducer and one transducer is a withdrawal weighted transducer.

12. A transducer according to claim 1, characterized in that said low reflection structure comprises fingers of said first electrode.

13. A transducer according to claim 12, wherein there are no fingers of said second electrode disposed between said two fingers of said first electrode.

14. A transducer according to claim 12, wherein at least one of said fingers of said first electrode included in said low reflection structure is not adjacent a finger of said second electrode.

* * * * *